United States Patent [19]

Miller

[11] Patent Number: 4,819,450

[45] Date of Patent: Apr. 11, 1989

[54] LOW COST INTERMEDIATE RADIATION SHIELD FOR A MAGNET CRYOSTAT

[75] Inventor: Russell S. Miller, Ballston Spa, N.Y.

[73] Assignee: General Electric Company, Schenectady, N.Y.

[21] Appl. No.: 56,173

[22] Filed: Jun. 1, 1987

Related U.S. Application Data

[62] Division of Ser. No. 816,086, Jan. 3, 1986, Pat. No. 4,694,663.

[51] Int. Cl.[4] ............................................. F25B 19/00
[52] U.S. Cl. .................................... 62/514 R; 220/423
[58] Field of Search ............... 62/45, 514 R; 220/901, 220/423, 424; 138/112, 114

[56] References Cited

U.S. PATENT DOCUMENTS

| | | |
|---|---|---|
| 3,416,693 | 12/1968 | Covington et al. ................. 220/423 |
| 3,487,971 | 1/1970 | Kirgis et al. ......................... 62/45 X |
| 4,055,268 | 10/1977 | Barthel ............................. 220/423 X |
| 4,287,720 | 9/1981 | Barthel ..................................... 62/45 |
| 4,492,090 | 1/1985 | Laskaris ................................... 62/55 |

Primary Examiner—Harry B. Tanner
Attorney, Agent, or Firm—William H. Steinberg; James C. Davis, Jr.; Paul R. Webb, II

[57] ABSTRACT

A radiation shield assembly is provided for a cryostat having a helium vessel and which inlcudes a penetration for cooling the helium vessel. The radiation shield assembly comprises a shield having means for conducting heat toward the cryostat penetration, means for providing an isothermal surface and means for reflecting radiation. The shield surrounds the helium vessel, and is spaced away from the helium vessel by spacer means comprising isolated packets of powder insulation in permeable packages.

6 Claims, 5 Drawing Sheets

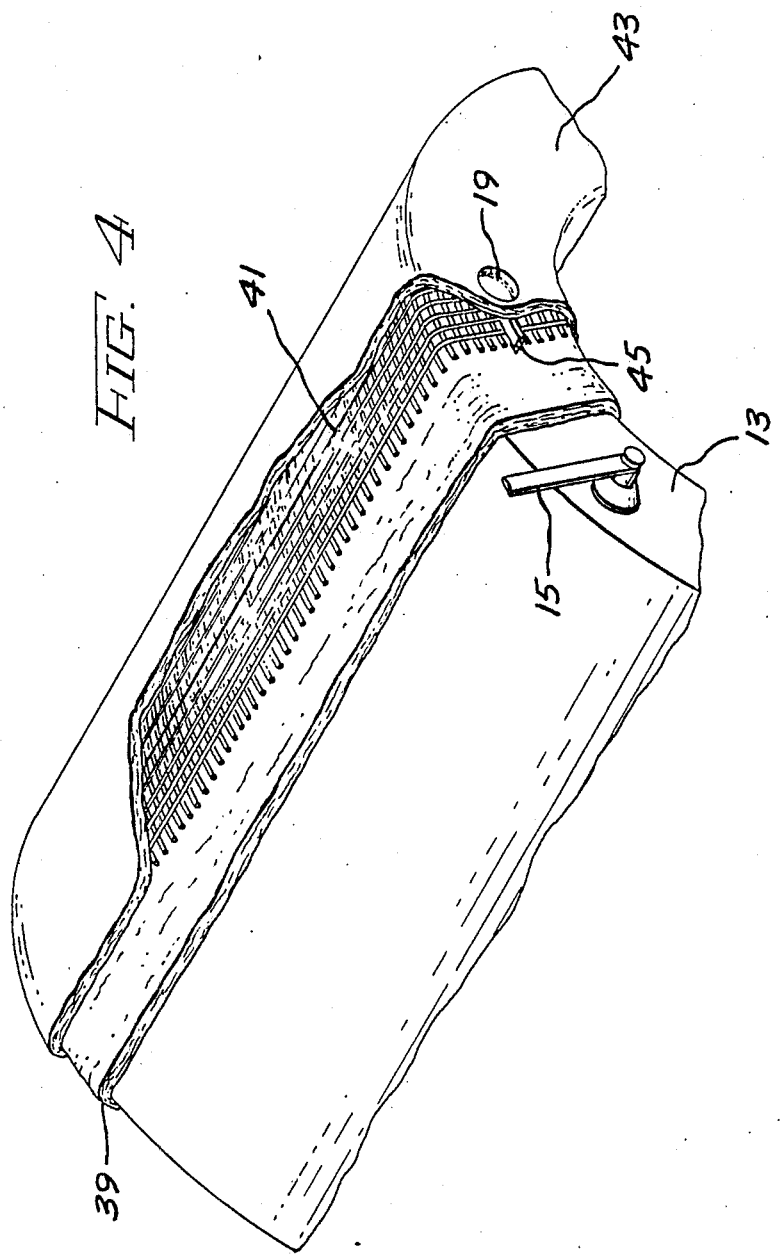

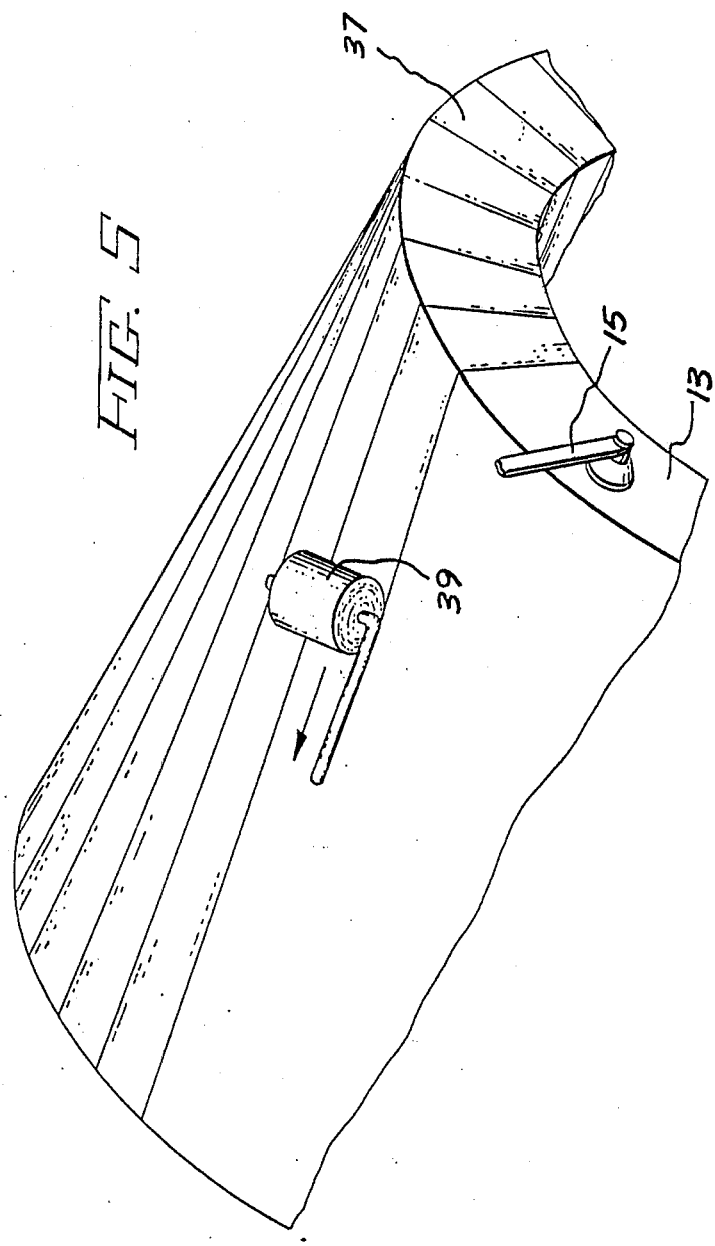

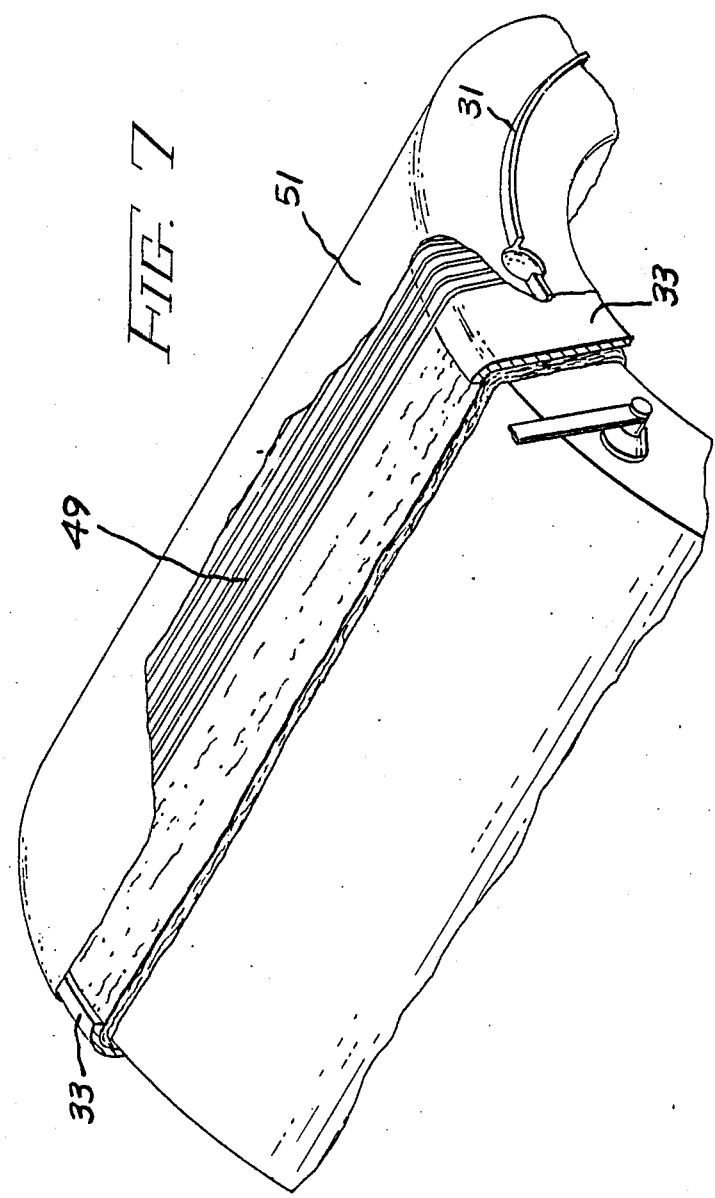

4,819,450

LOW COST INTERMEDIATE RADIATION SHIELD FOR A MAGNET CRYOSTAT

This application is a division of application Ser. No. 816,086, filed 1/3/86 now U.S. Pat. No. 4,694,663.

BACKGROUND OF THE INVENTION

The present invention relates to radiation shields used in superconducting magnet cryostats.

The construction of a low cryogen loss superconducting magnet cryostat generally requires the use of at least two radiation shields between a liquid helium vessel and ambient. Typically, the warmer shield will be liquid nitrogen cooled and the colder shield will be helium boil off gas cooled. The colder shield, referred to as the intermediate shield, can be supported by tie rods serving as tension members from the nitrogen vessel, which is in turn supported by tie rods from the ambient. Tie rods from the nitrogen vessel also support the helium vessel. The tie rod method of support requires that the shield be sufficiently rigid so that the space between the intermediate shield and the other vessels can be kept to a minimum without danger of thermal shorts developing (heat transfer does not benefit from increased spacing in a vacuum). An example of this type construction is shown in U.S. Pat. No. 4,492,090, entitled "Cryostat For NMR Magnet".

Long tension supports are standard practice for high performance cryostats; titanium and glass fiber composites are commonly used materials. In vertical dewars, intermediate radiation shields can be supported by a single connection on the dewar neck, an option not available for the horizontal magnetic resonance magnets.

The highest performance insulation systems currently available consist of some type of multilayer insulation. Application of multilayer insulation is labor intensive and cannot ordinarily be justified for use at liquid helium temperatures. Also, relatively small errors in the application of the insulation can substantially reduce its effectiveness compared to hard vacuum. Multilayer insulations are widely used and assume various forms including dimpled or crinkled foil layers and foil or aluminized plastic, separated with glass fiber mats. Typical application to the annular shaped vessels in an magnetic resonance cryostat requires wrapping on the outside diameter of the vessel, wrapping on the inside of the vessel and then interweaving the wrapped layers with "doughnut" shaped layers on the end caps. Since wrapping on the inside diameter is not possible, the inside diameter wrapping must be made on a form and held in place until the interweaving operation is complete.

It is an object of the present invention to eliminate tie rod support of the intermediate shield in the cryostat of a superconducting magnet thereby reducing the complexity of the nitrogen vessel and simplifying cryostat assembly.

SUMMARY OF THE INVENTION

In one embodiment of the present invention a radiation shield assembly is provided for a cryostat having a helium vessel and which includes a penetration for cooling the helium vessel. The radiation shield assembly comprises a shield having means for conducting heat toward the cryostat penetration, means for providing an isothermal surface and means for reflecting radiation. The shield surrounds the helium vessel, and is spaced away from the helium vessel by spacer means comprising isolated packets of powder insulation in permeable packages.

In another aspect of the present invention a radiation shield assembly is provided for a cryostat having a helium vessel and which includes a penetration for cooling the helium vessel. The radiation shield assembly comprising a plurality of layers of multilayer insulation surrounding the helium vessel. A flexible shield including means for conducting heat toward the cryostat penetration and means for providing an isothermal surface surrounds the multilayer insulation. Clamp means hold the mesh shield under tension around the multilayer insulation to prevent shield sagging.

DESCRIPTION OF THE DRAWING

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

FIG. 4 is a partial cutaway isometric view of a helium vessel surrounded by another embodiment of an intermediate shield in accordance with the present invention;

FIG. 5 is a partial isometric of a helium vessel being spirally wrapped with multilayer insulation in accordance with the present invention;

FIG. 7 is a partial cutaway isometric of a helium vessel surrounded by another embodiment of an intermediate shield in accordance with the present invention.

DETAILED DESCRIPTION OF THE INVENTION

Figure 1:
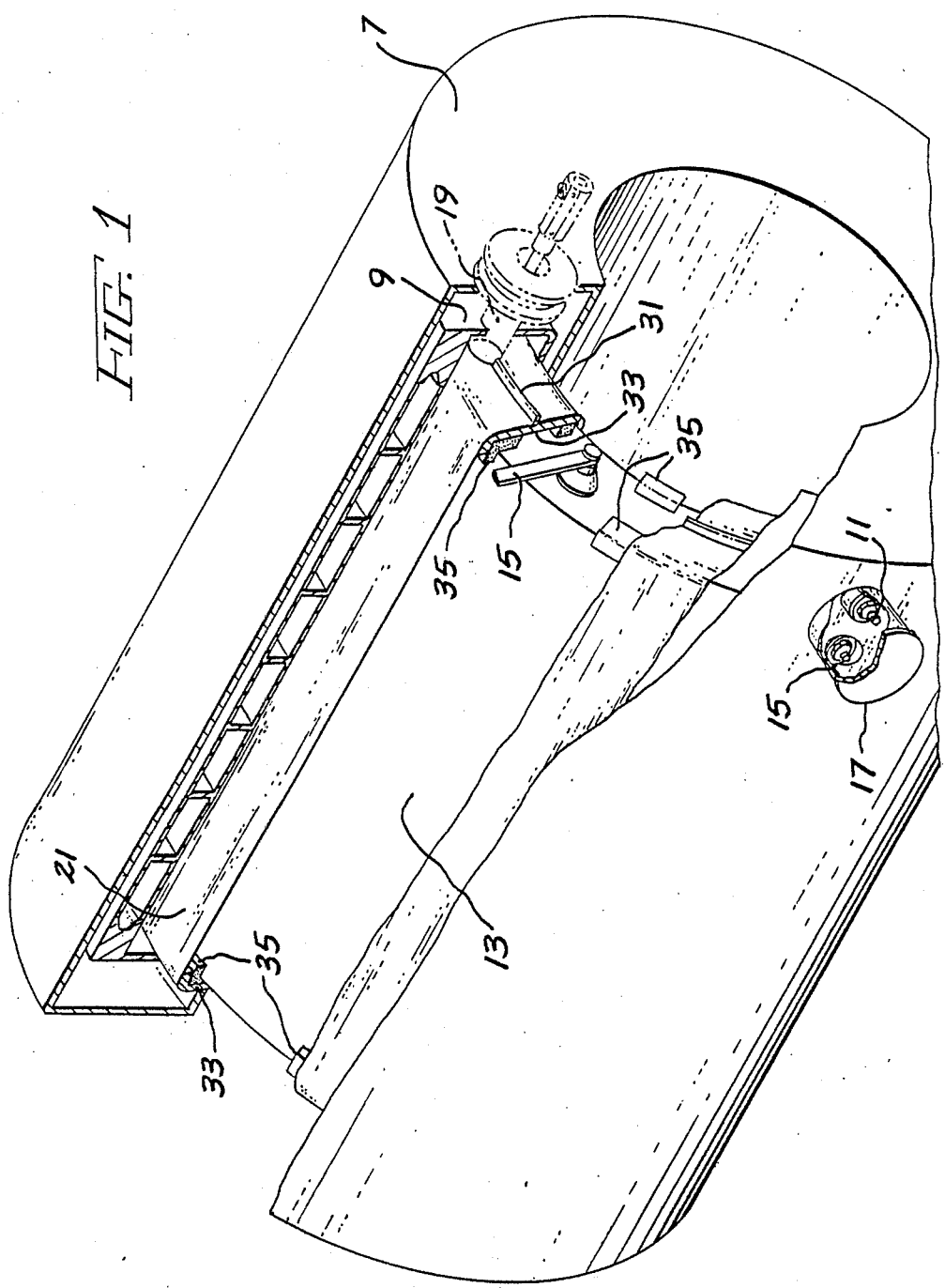
FIG. 1 is a partially cutaway isometric view showing a cryostat with an intermediate shield in accordance with the present invention.

Referring now to the drawing in which like elements are indicated by like numerals throughout and particularly FIG. 1 thereof, a cryostat assembly comprising a generally cylindrical shaped outer evacuable vessel 7 defining a longitudinal bore therethrough, is shown. Situated inside the outer vessel is a generally cylindrical nitrogen vessel 9, defining a longitudinal bore and having substantially the same longitudinal axis as the evacuable vessel 7. The nitrogen vessel 9 is supported by the outer vessel using tie rods under tension (only one of which is shown) connected between the nitrogen vessel and the evacuable vessel, so that there is no contact other than through the tie rods between the vessels.

Situated inside the nitrogen vessel is a helium vessel 13, wherein superconducting temperatures can be maintained and a superconducting magnet (not shown) is located for magnetic resonance imaging and spectroscopy applications. The helium vessel 13 is generally cylindrical, defining a central bore and has substantially the same longitudinal axis as the nitrogen vessel. The helium vessel is supported by the nitrogen vessel using tie rods 15 under tension that extend between the helium vessel 13 and the nitrogen vessel 9, separating the vessels from one another. The tie rods 11 and 15 are accessible for adjustment through openings in the outer vessel (only one of which is shown) covered by caps 17. A cryostat penetration 19, to permit electrical connections to the magnet in the supercooled helium vessel, to allow nitrogen and helium to be added and to permit gas boiloff during operation extends through the outer vessel through the nitrogen vessel and into the helium vessel. For a more detailed description of the arrangement of the tie rod supports between the evacuable vessel 7, nitrogen vessel 9 and the helium vessel 13, see U.S. Pat. No. 4,492,090 entitled, "Cryostat For NMR Magnet", assigned to the instant assignee and hereby incorporated by reference.

Figure 2:
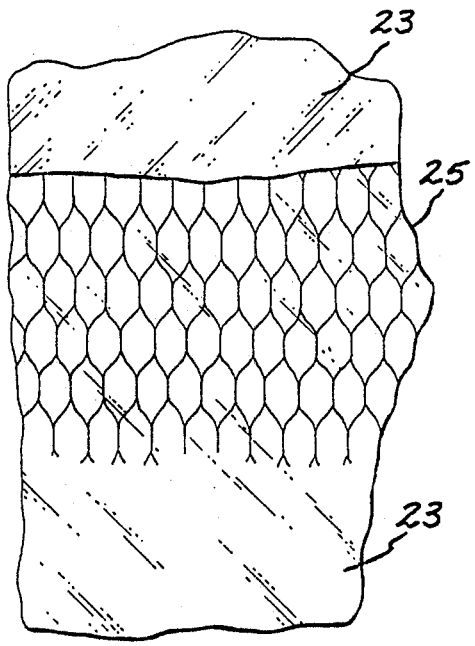
FIG. 2 is a cutaway plan view of a shield comprising slit sheet mesh bonded between two sheets of reflective foil, in accordance with the present invention.
Figure 3:
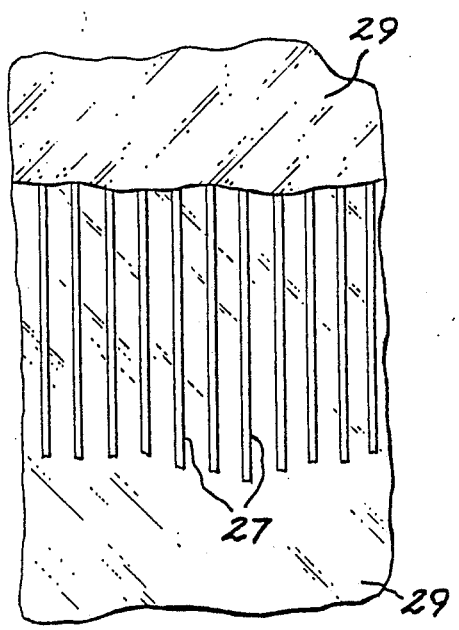
FIG. 3 is a cutaway plan view of a shield comprising parallel wires bonded between two sheets of reflective foil.

Referring now to FIGS. 1 and 2, an intermediate shield 21 comprising reflective sheets of foil 23 bonded on either side of heat conducting mesh 25, surrounds the helium vessel 13. The foil has a low emissivity and comprises highly reflective aluminum foil or alternatively highly reflective aluminized plastic film. The heat conducting mesh preferably comprises a slit sheet type mesh 25, fabricated from a copper sheet. A cutaway view of the intermediate shield is shown in FIG. 2. Alternatively, the intermediate shield can be fabricated with mesh of the type shown in the cutaway view of FIG. 3. In FIG. 3, parallel wires 27, preferably copper, are bonded between two reflective sheets 29 of foil. The wires all extend in one direction and when the shield surrounds the helium vessel the wires are situated so that they extend in a longitudinal direction. Referring again to FIG. 1, the intermediate shield 21 is secured under tension using clamps 31 around end rings 33. The end rings 33 are supported by isolated packets of powdered insulation 35 in contact with the helium vessel and under compression. The end rings which are fabricated from a relatively stiff nonmagnetic material, such as stainless steel or aluminum, have an axially ledge extending from the ring periphery towards the helium vessel. The isolated packets are positioned so that in addition to spacing the shield from the end of the helium vessel they also support the weight of the end rings, with the end plate ledges resting on the insulation packet axial extensions which extend over the helium vessel.

The isolated packets comprise insulating material of compacted structure and of low thermal conductivity such as particles formed of fine silica powder. The packets are enclosed in a low conductivity porous membrane. The cryostat is evacuated prior to cooling and the porous membrane allows air to escape from the insulation packets. The intermediate shield is joined together over the end rings and is placed under tension. Tensioning prevents the unsupported portions of the shield from contacting the helium vessel and from sagging and contacting the nitrogen vessel. In a typical MR cryostat, there are approximately 20 square meters of surface area on the outside of the helium vessel. If 1/50 of this area is used for powder insulation shield spacers, performance comparable to the rod support of intermediate shields would be possible. A conductivity of approximately 20 $\mu$W/cm-K with compressive loadings of 10-50 psi were assumed.

Figure 6:
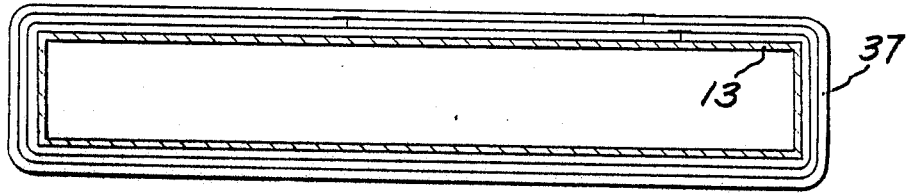
FIG. 6 is a partial cross section of a helium vessel wrapped with discrete layers of multilayer insulation in accordance with the present invention.

Another embodiment of the present invention is shown in FIG. 4. A helium vessel 13 is wrapped with multilayer insulation 37. Multilayer insulation can be applied as shown in FIG. 5, by spirally wrapping insulation having a width greater than 1 inch, to avoid problems of anisotropic conductivity between adjacent reflective layers. The insulating material is dispensed from a spool 19 transferred from carrier to carrier to wrap the annular vessel 13. Alternatively, the multilayer insulation can be applied as shown in FIG. 6, by using short strips of multilayer insulation wrapped around the vessel and stitched or bonded together. Three discrete layers of a multilayer insulation are shown in FIG. 6. Either method allows the vessel to remain stationary during wrapping, although support of the helium vessel must be transferred back and forth between tie rod lugs to allow wrapping mechanism passage.

The multilayer insulation 37 in FIG. 4 provides support for shield 41. Since the support is continuous, the shield only needs to be thick enough to conduct heat to the cryostat penetration 19 where it will be gas or refrigerator cooled. Typically, only a few watts need to be transferred, and the maximum distance of transfer is about 2 meters. An extremely conservative estimate (room temperature copper conductivity and the full 2 meter conduction path for the entire 2 watts transfer and 1K temperature drop) requires a shield of less than 250 pounds. Since the shield typically operates at temperatures between 20° and 400° K., copper conductivities 2 or 3 times higher should be easily achieved, reducing shield weight to less than 100 lbs. If the weight of this shield is distributed over the top third of the helium vessel, the average compressive loading on the multilayer insulation would only be 0.02 psi.

The shield 41 must still be stiff enough that it does not sag against the nitrogen shield on the bottom sides of the helium vessel. As shown in FIG. 4 multilayer insulation 43 is wrapped around the shield to act as a spacer between the intermediate radiation shield 41 and the nitrogen shield (not shown).

A shield design which promotes easy construction when surrounded by multilayer insulation comprises a fine wire mesh of copper wire as shown in FIG. 4. The wire mesh can be formed around corners and clamped together at the ends of the cylindrical vessel using clamps 45. The mesh presents a heat sink to the adjacent foil layers of the multilayer insulation at sufficiently close intervals to keep them nearly isothermal at the shield temperature. A mesh bonded to foil layers as shown in FIG. 2 would also act effectively in this capacity, with the circumferential wires in the mesh used to provide uniform spacing of the axial heat conducting wires being replaced by foil, yielding an even simpler structure than the mesh.

Referring now to FIG. 7, an alternative way to provide a shield 49 that is stiff enough so that it does not sag against the nitrogen shield is to tension the shield around the multilayer insulation 37 using clamps 31. To avoid compressive forces on the corners of the multilayer insulation which increases conductivity losses relatively stiff end rings 33 of nonmagnetic material such as stainless steel or aluminum are positioned at the ends of the helium vessel. The rings have an axially extending ledge extending from the ring periphery over the multilayer insulation to support the end rings. Shield 49 comprises parallel longitudinally extending copper wires bonded to a foil sheet 51. Multilayer insulation is not used between the shield 49 and the nitrogen vessel (not shown) since the foil sheet 51 serves as a radiation shield.

Since the foil sheets used with the wire mesh in FIGS. 1, 4 and 6 do not have to have appreciable structural strength they can be chosen for minimum emissivity. A reduction in emissivity from 0.05 to 0.03, for example, can result in a 10% reduction in helium boil off.

In the embodiment of FIG. 1 radiation losses are reduced by the reflective foil layers on either side of the mesh, which is maintained at a constant temperature by helium boiloff or refrigeration. In the embodiment of FIG. 4, the foil layers of the multilayer insulation provides radiation shielding. In the embodiment of FIG. 6, radiation shielding between the shield and the helium vessel is provided by the multilayer insulation and radiation shielding from the nitrogen vessel to the intermediate shield is provided by the foil layer of the shield.

The foregoing describes a low cost intermediate radiation shield for a cryostat which eliminates the rod support of the intermediate shield.

While the invention has been particularly shown and described with reference to several embodiments thereof, it will be understood by those skilled in the art that various changes in form and detail may be made without departing from the spirit and scope of the invention.

What is claimed is:

1. A radiation shield assembly for a cryostat having a generally cylindrical inner helium vessel, said cryostat defining a penetration for cooling the helium vessel, said radiation shield assembly comprising:

a plurality of layers of multilayer insulation surrounding the helium vessel;

a pair of rigid end rings each having a flange extending axially from the ring periphery, said rings fabricated from nonmagnetic material and having a diameter greater than the ends of the generally cylindrical inner helium vessel when surrounded by said multilayer insulation, one of said end rings situated adjacent to each end of the helium vessel with said end ring flanges extending over the multilayer insulation and supported thereby;

a flexible shield including means for conducting heat toward the cryostat penetration and means for providing an isothermal surface, said shield surrounding the multilayer insulation wrapped helium vessel and said rigid end rings; and clamping means for holding said flexible shield under tension around said end rings to prevent said flexible shield from sagging.

2. The radiation shield assembly of claim 1 wherein said shield comprises parallel lengths of wire bonded to a reflective sheet of foil, said parallel lengths of foil situated adjacent said multilayer insulation and arranged to conduct heat toward the cryostat penetration.

3. The radiation shield assembly of claim 1 wherein said shield comprises a slit sheet mesh of heat conductive material bonded to a reflective foil sheet, said slit sheet mesh situated adjacent to said multilayer insulation.

4. A radiation shield assembly for a cryostat having a helium vessel, said cryostat defining a penetration for cooling the helium vessel, said radiation shield assembly comprising:

a plurality of layers of multilayer insulation surrounding said helium vessel;

a flexible shield including means for conducting heat toward the cryostat penetration and means for providing an isothermal surface, said shield surrounding said multilayer insulation;

clamp means for holding said shield under tension around said multilayer insulation to prevent shield sagging.

5. The radiation shield assembly of claim 4 wherein said shield comprises parallel lengths of wire bonded to a reflective sheet of foil, said parallel lengths of foil situated adjacent said multilayer insulation and arranged to conduct heat towrd the cryostat penetration.

6. The radiation shield assembly of claim 4 wherein said shield comprises a slit sheet mesh of heat conductive material bonded to a reflective foil sheet, said slit sheet mesh situated adjacent to said multilayer insulation.

* * * * *